United States Patent [19]

Cilingiroglu

[11] Patent Number: 5,124,660
[45] Date of Patent: Jun. 23, 1992

[54] IDENTIFICATION OF PIN-OPEN FAULTS BY CAPACITIVE COUPLING THROUGH THE INTEGRATED CIRCUIT PACKAGE

[75] Inventor: Ugur Cilingiroglu, College Station, Tex.

[73] Assignee: Hewlett-Packard Company, Palo Alto, Calif.

[21] Appl. No.: 631,609

[22] Filed: Dec. 20, 1990

[51] Int. Cl.$^5$ ............................................. H01H 31/04
[52] U.S. Cl. .................................. 324/538; 324/555; 324/718; 324/158 R
[58] Field of Search ............... 324/537, 538, 540, 555, 324/718, 158 R

[56] References Cited

U.S. PATENT DOCUMENTS

| | | | |
|---|---|---|---|
| 4,056,773 | 11/1977 | Sullivan | 324/537 X |
| 4,186,338 | 1/1980 | Fichtenbaum | 324/537 X |
| 4,779,041 | 10/1988 | Williamson, Jr. | 324/537 |
| 4,789,829 | 12/1988 | Stribling | 324/718 X |
| 5,006,808 | 4/1991 | Watts | 324/537 |

FOREIGN PATENT DOCUMENTS 2143954A 2/1985 United Kingdom ............... 324/537

*Primary Examiner*—Kenneth A. Wieder
*Assistant Examiner*—Glenn W. Brown

[57] ABSTRACT

Disclosed is a system that determines whether input and output pins of semiconductor components are present and properly soldered to a printed circuit board. The system includes an oscillator which is connected to a metallic electrode placed on top of an integrated circuit package. A probe pin in a bed of nails tester is connected to a current measuring device and connected to a printed circuit board wiring trace that is soldered to the pin being tested. The oscillator signal is capacitively coupled through the integrated circuit package to the pin being tested, so if current is measured by the current measuring device, the pin is connected to the printed circuit board.

11 Claims, 4 Drawing Sheets

IDENTIFICATION OF PIN-OPEN FAULTS BY CAPACITIVE COUPLING THROUGH THE INTEGRATED CIRCUIT PACKAGE

FIELD OF THE INVENTION

This invention relates to measuring and testing devices and more particularly to in-circuit testing devices. Even more particularly, the invention relates to in-circuit testing of connections between an integrated circuit and a printed circuit board.

BACKGROUND OF THE INVENTION

It is important that electronic components and printed circuit boards be tested after the components have been soldered to the printed circuit boards. Several different approaches have been developed for testing the components and printed circuit boards, including functional testing, in-circuit testing, and manufacturing defect analyzers.

Functional testing uses a procedure of applying predetermined input signals and monitoring the output of a printed circuit board to determine if all of the components are present and operating properly on the circuit board. While functional testing provides a way of determining whether the P.C. board is functioning properly, it provides little or no information regarding the functioning of individual components on the board. Complex programming techniques have been used to provide limited information as to the location of non-functioning components on the board by carefully selecting input data and analyzing the output results. Such systems are complex, often costly to implement, and normally provide only vague information as to the location of malfunctioning components.

Because of the limitations of functional testing, in-circuit testing techniques have been used to individually test the components on the printed circuit board to determine if these components are working properly. This process uses a "bed of nails" tester to access each individual component and test that component individually. In this manner, non-functioning components can be identified and replaced to prevent the entire circuit board from being scrapped. This process works well for simple components where circuit inside the component is known and can be easily tested. If the component being tested is very complex, or if the circuit inside the component is unknown, in-circuit testing may not achieve satisfactory results.

Manufacturing defect analyzers are another class of testing devices that provide simpler tests and are less expensive to implement. These devices are designed to locate manufacturing faults, such as shorts on a printed circuit board, missing integrated circuits, bent component pins, etc. Although these devices do a reasonably good job of finding shorts and gross analog faults, they are marginal when testing digital sections of the board.

One very important potential problem that must be tested on every printed circuit board is whether all the pins of every component are soldered to the circuit board. Functional testing may miss a particular pin, if the functions performed by that particular pin are not thoroughly tested in functional test. Testing for this type of fault is particularly difficult when the circuit inside the component is unknown, such as the case with application specific integrated circuits (ASICs). Because of the large number of ASICs and the complexity of these devices, it is often not feasible to design an in-circuit test or a functional test to isolate this particular component.

There is need in the art then for a device and method which will determine whether all pins of a component are soldered to a circuit board. There is further need in the art for such a device and method which does not rely on the circuit contained in the component. The present invention meets these needs.

SUMMARY OF THE INVENTION

It is an aspect of the present invention to provide an apparatus and method to test for a connection between a pin of a component and a printed circuit board.

It is another aspect of the invention to provide such an apparatus and method that does not rely on the circuit contained inside the component.

The above and other aspects of the present invention are accomplished in a system that overcomes the disadvantages and limitations of the prior art by providing an apparatus and method for determining whether semiconductor components are present and properly connected to a printed circuit board. The present invention determines whether all connector pins, including input, output, power and ground, are connected to the printed circuit board regardless of the integrated circuit family being used.

Specifically, the invention uses a metallic electrode, such as copper foil, placed on top of a non-conducting integrated circuit package. A connection is then made, through a bed of nails tester, to a printed circuit board wiring trace that connects to the pin being tested. This connection is in turn connected to a current measuring device and an oscillator. An output of the oscillator is connected to the metallic foil. The oscillator is then set to supply a current to the copper foil, typically a one megaHertz (1 MHz) signal at ten (10) volts, and this current is capacitively coupled through the integrated circuit package to the pin being tested. Current is measured flowing out of the pin onto the printed circuit board wiring trace, and if this current exceeds a predetermined threshold, the pin is considered to be connected.

Because the metallic electrode covers the entire integrated circuit package, it also capacitively couples to all other pins on the package and these pins conduct into the printed circuit wiring traces to which they are connected. Since printed circuit traces often run in parallel, a small capacitive coupling occurs between the printed circuit traces, causing a secondary or shunt current to be conducted from these other pins to the wiring trace being tested. Therefore, the current measured from the pin under test must exceed a threshold, larger than the shunt current, before the pin is considered to be connected to the printed circuit board. Typically, eighty percent (80%) of the current flowing out of the pin under test flows out of the pin under test, and twenty percent (20%) is provided by the shunt current capacitively coupled from the other pins.

BRIEF DESCRIPTION OF THE DRAWINGS

The above and other objects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
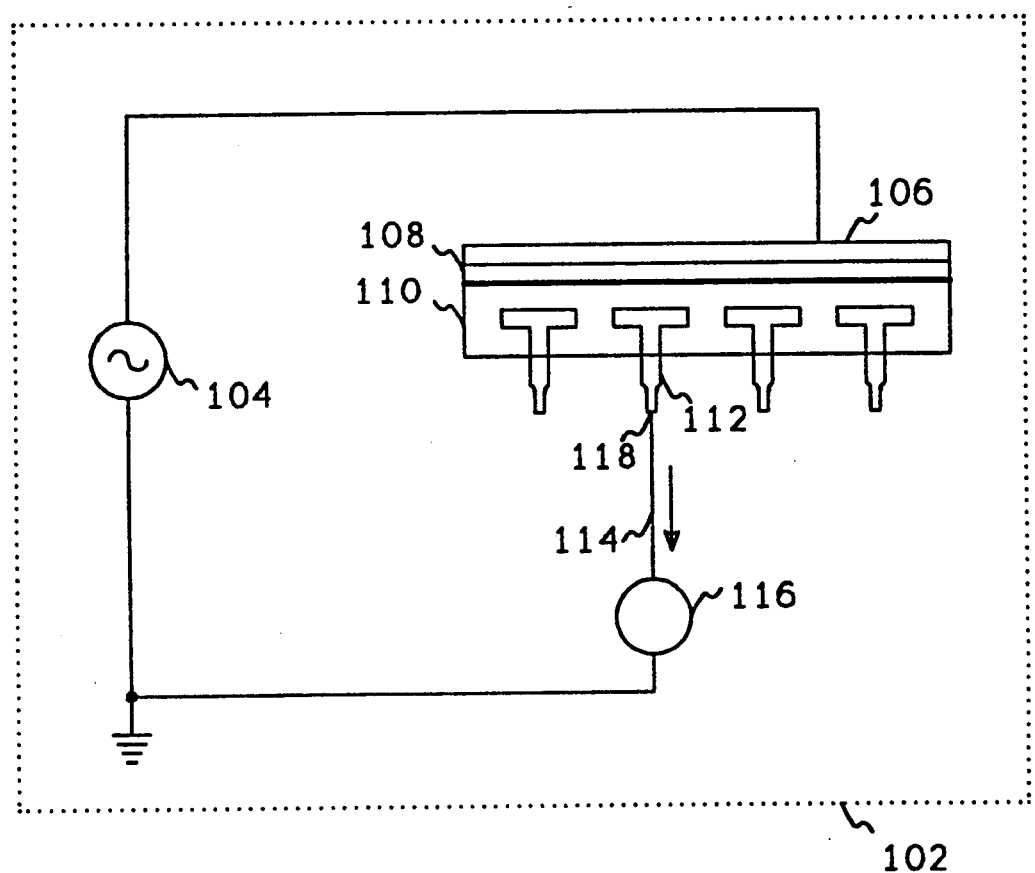
FIG. 1 shows a schematic diagram of the invention.

FIG. 1 shows a schematic diagram of the invention. Referring now to FIG. 1, the system of the present invention 102 uses an oscillator 104 which supplies an alternating current signal, typically one megaHertz (1 MHz) at ten (10) volts. The output of the oscillator 104 is connected to a metallic electrode 106 which is placed on top of an integrated circuit package 110. An insulator 108 may be placed between the electrode 106 and the integrated circuit package 110. A pin under test 112 is connected to an integrated circuit trace 114 which is connected to a current measuring device, such as an ammeter, 116. The connection to the ammeter 116 is typically made through a bed of nails connecting device.

When the test is performed, the oscillator 104 is activated and a current is conducted to the electrode 106. Through capacitive coupling, the current is passed to the pin 112 of the integrated circuit 110. The current 112 then passes through a connection to a printed circuit board trace 114 and the current then passes to the ammeter 116 which measures the amount of current. If a threshold amount of current is measured by the ammeter 116, then the pin 112 must be connected to the integrated circuit trace 114 at location 118. If the pin 112 is not connected at location 118, no current will be conducted to the integrated circuit trace 114 and no current will be measured by the ammeter 116 indicating that a pin open fault is present.

Figure 2:
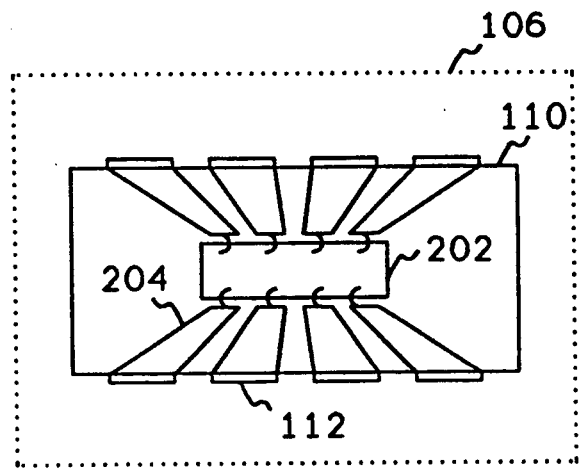
FIG. 2 shows a top cutaway view of an integrated circuit.
Figure 3:
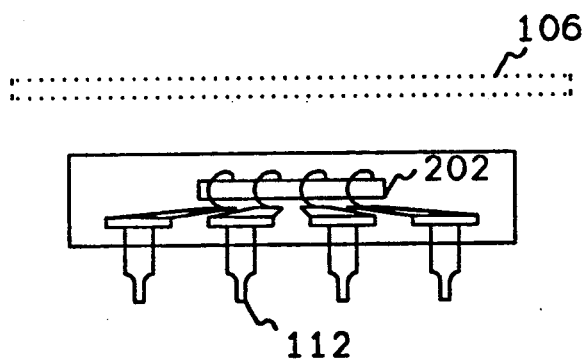
FIG. 3 shows a side cutaway view of an integrated circuit and illustrates, along with FIG. 2, how the capacitive coupling occurs.

FIG. 2 shows a top cut away view of the integrated circuit 110 and the electrode 106, and FIG. 3 shows a side cut away view of the integrated circuit 110 and the electrode 106. FIGS. 2 and 3 illustrated how the capacitive coupling occurs between the electrode and the pins of the integrated circuit. Referring now to FIGS. 2 and 3, the integrated circuit package 110 contains an integrated circuit 202. The integrated circuit 202 contains connections, however, which must be made to the outside of the integrated circuit package 110. Therefore, the pin 112 is connected to an internal conductor 204 which connects the pin 112 to a location just adjacent the integrated circuit 202. There a small wire spans between the conductor 204 and a location on the integrated circuit 202. Similar connections are made to all the other pins of the integrated circuit package 110.

The conductor 204 forms a metallic plate, which acts as one plate of a capacitor. The other plate of the capacitor is the electrode 106, here illustrated by dashed lines, indicating that the conductor 106 is placed over the top of the integrated circuit package 110. Although the capacitor created in this manner is small, it is sufficient to conduct a signal from the electrode 106 to the pin 112.

Figure 4:
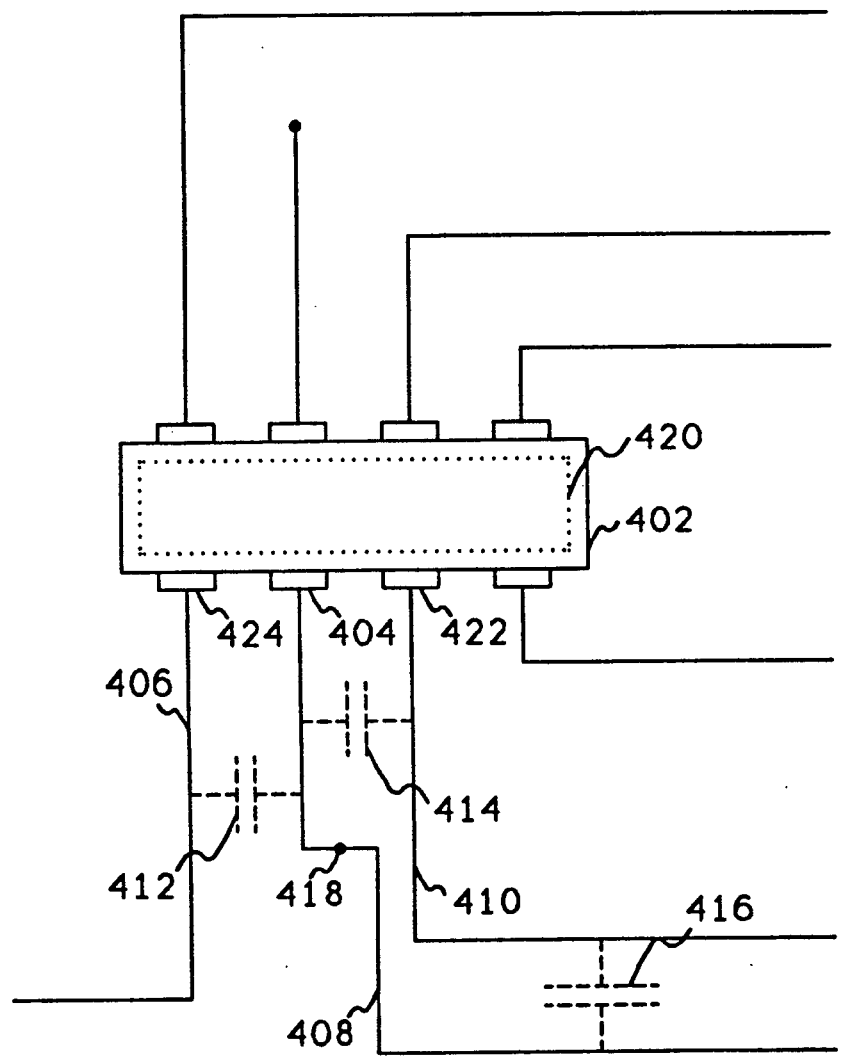
FIG. 4 shows an integrated circuit and associated printed circuit traces, and illustrates shunt current.

FIG. 4 shows an integrated circuit package and associated printed circuit traces that connect the leads to other circuits. Referring now to FIG. 4, an integrated circuit package 402 contains a pin 404 which is to be tested using the system of the present invention. The pin 404 is connected to a printed circuit wiring trace 408 which connects it to other integrated circuits on the printed circuit board. Through a bed of nails tester (not shown), a connection is made to the printed circuit trace 408 at a location 418. An electrode 420, here illustrated by dashed lines, is placed over the integrated circuit package 402 and connected to an oscillator (not shown in FIG. 4), as described above with respect to FIG. 1. The bed of nails tester (not shown) connects to the printed circuit 408 at 418 and also connects to an ammeter (not shown) which will measure the current from tune pin 404. When the oscillator is activated, the signal from electrode 420 is conducted to pin 404 and if a soldered connection has been made, where pin 404 contacts the printed circuit board, the current from pin 404 will flow through the printed circuit 408 and out to the ammeter (not shown) through the connection at 418. However, because the electrode 420 covers the entire integrated circuit package 402, current will also be conducted to the other seven pins of the integrated circuit package 402. Through the same process that current is conducted to pin 404, current is also conducted to pin 424 and pin 422, etc. The current that flows to pin 424 flows through printed circuit wiring trace 406. Because the printed circuit wiring trace 406 and the printed circuit wiring trace 408 run parallel to each other on the printed circuit board, the wiring traces form plates of a small capacitor, here illustrated by the capacitor 412 formed with dashed lines. This capacitor will conduct some of the current flowing through in printed circuit wiring trace 406 to the printed circuit wiring trace 408. Likewise, current flowing from pin 422 into printed circuit trace 410 will be conducted to the printed circuit wiring trace 408 through capacitors 414 and 416. Therefore, the current being measured at location 418 is the sum of the current flowing through pin 404 and current flowing through pins 424 and 422 after the current passes through the capacitors 412, 414 and 416. The current that flows through capacitors 412, 414 and 416 is called shunt current, and comprises about twenty (20%) to fifty percent (50%) of the current that will flow through connection 418. Note that capacitors 412, 414, and 416 are not components on the printed circuit board, but instead are formed by the printed circuit wiring traces running in parallel.

Because of the shunt current that may flow into a connection, the ammeter must detect a certain threshold amount of current before the pin under test is considered connected. Although typically the shunt current is approximately twenty percent (20%) of the total current, it could be higher. This shunt current can be reduced by grounding all the printed circuit wiring traces that are not being used in the test. Also, the power input and ground pins of the integrated circuit being tested can be grounded to decrease the amount of shunt current.

Figure 5:
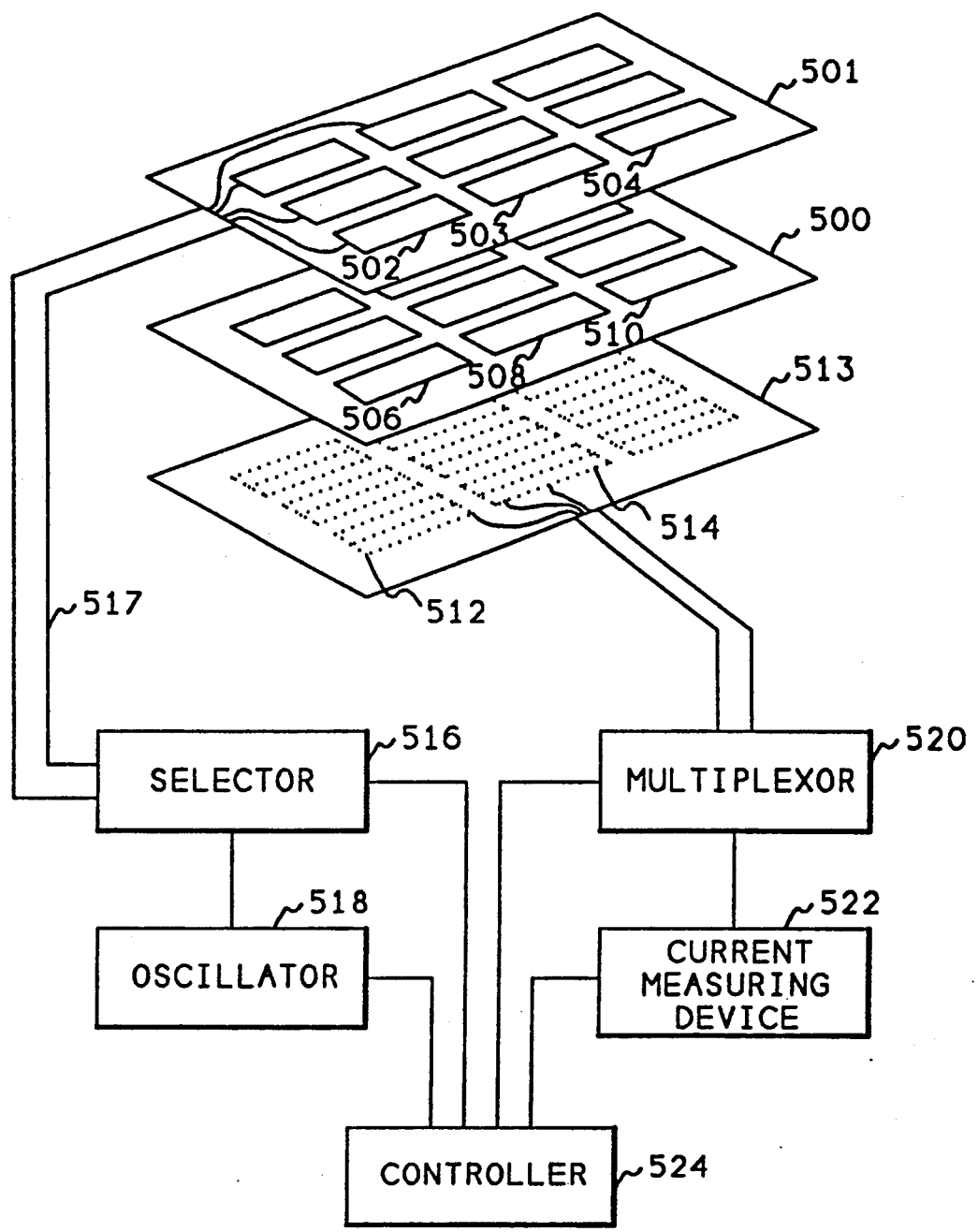
FIG. 5 shows the invention being used to test a plurality of integrated circuits on a printed circuit board.

FIG. 5 shows a diagram of the invention when used to test an entire printed circuit board. Referring now to FIG. 5, a printed circuit board 500 contains a plurality of integrated circuits 506, 508, 510, etc. A board 501, which contains a plurality of electrodes 502, 503, 504, etc., is placed over the top of the printed circuit board 500. A bed of nails tester 513, containing a plurality of probe pins 512, 514, etc., is brought into contact with the bottom of the printed circuit board 500 to connect to the printed circuit wiring traces on the printed circuit board 500. An oscillator 518 supplies a current to a selector 516. The selector 516 has a plurality of outputs, one for each of the metallic electrodes on the board 501. A cable 517, containing wires to connect to all the electrodes, connects the output of the selector to the board 501. A multiplexor 520 contains a series of inputs, one for each of the pins on the bed of nails tester 513. The output of the multiplexor is connected to a current measuring device 522. A controller 524 is connected to the oscillator 518, the selector 516, the multiplexor 520, and the current measuring device 522.

To test all the integrated circuits on the printed circuit board 500, the controller first selects one of the electrodes on the board 501 by programming the selector 516. The controller then activates the oscillator 518 to supply a current through the selector 516 to the electrode on the board 501 which is directly over the top of the integrated circuit being tested. The controller 524 then selects one of the pins from the bed of nails tester 513 by programming the multiplexor 520. The pin selected will be the pin that connects to a printed circuit board trace on the printed circuit board 500 which is connected to the particular pin of the particular integrated circuit being tested. After the multiplexor is programmed to select the correct pin, the controller activates the current measuring device 522 to determine whether the proper amount of current is present on the printed circuit board trace on the board 500. The correct amount of current is determined, as described above with respect to FIG. 4, by first determining the amount of shunt current (using a fully functional board in a separate test) that will be capacitively coupled to the trace and then determining whether the current measured exceeds the shunt current.

This process is then repeated for each pin of each integrated circuit on the board. It is important to note that this process is independent of the integrated circuit family, and easily tests TTL, CMOS, etc., and can test multiple families on the same printed circuit board.

Having thus described a presently preferred embodiment of the present invention, it will now be appreciated that the objects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A system for testing a printed circuit board containing a plurality of electrical components to determine whether a plurality of connector pins on each of the electrical components are conductively connected to a plurality of traces on the printed circuit board, said system comprising:
   signals means for supplying an electrical current;
   a plurality of conductive electrodes each connected to said signal means, each of said plurality of conductive electrodes having a surface in proximity with a surface of one of the electrical components;
   a plurality of probe means for connecting to each of the plurality of traces of the printed circuit board;
   multiplexor means having a plurality of inputs, one input connected t each of said plurality of probe means;
   current measuring means connected to an output of said multiplexor means; and
   means for selecting one of said problem means through said multiplexor means, activating said signal means, activating said current measuring means and indicating an error condition if said current measuring means fails to detect said electrical current.

2. The system of claim 1 wherein each of said conductive electrodes is located abutting a non-conductive body of one of the electrical components.

3. The system of claim 1 wherein each of said conductive electrodes comprises metallic foil.

4. The system of claim 1 wherein said signal means supplies an alternating current signal.

5. The system of claim 1 wherein said means for selecting one of said probe means through said multiplexor means comprises electronic controller means.

6. A system for testing a printed circuit board containing a plurality of electrical components to determine whether a plurality of connector pins on each of the electrical components are conductively connected to a plurality of traces on the printed circuit board, said system comprising:
   signal means for supplying an electrical current;
   selector means connected to an output of said signal means;
   a plurality of conductive electrodes each connected to one output of said selector means and each having a surface in proximity with a surface of one of the electrical components;
   a plurality of probe means for connecting to each of the plurality of traces of the printed circuit board;
   current measuring means connected to an output of each of said plurality of probe means; and
   means for selecting one of said conductive electrodes through said selector means, activating said signal means, activating said current measuring means and indicating an error condition is said current measuring means fails to detected said electrical current.

7. The system of claim 6 wherein each of said conductive electrodes is located abutting a non-conducive body of one of the electrical components.

8. The system of claim 6 wherein each of said conductive electrodes comprise metallic foil.

9. The system of claim 6 wherein said signal means supplies an alternating current signal.

10. The system of claim 6 wherein said means for selecting one of said conductive electrodes through said selector means comprises electronic controller means.

11. A system for testing a printed circuit board to determine whether a plurality of connector pins of a plurality of components on the circuit assembly are each conductively connected to a plurality of traces on the printed circuit board, said system comprising:
   signal means for supply an alternating electrical current;
   selector means having an input connected to an output of said signal means and having a plurality of selectable outputs;

a plurality of conductive electrodes, one of said conductive electrodes connected to each of said plurality of outputs of said selector means, wherein each of said conductive electrodes has a surface in proximity with a surface of one of the plurality of components;

a plurality of probe means for connecting to each of the plurality of traces of the printed circuit board;

multiplexor means having an output and a plurality of selectable inputs, one of said inputs connected to each of said plurality of probes; and current measuring means connected between said output of said multiplexor means and a common connection of said signal means to use said supplied current for measuring a current between a selected conductive electrode and a selected trace and for indicating a fault when said measured current is below a predetermined threshold.

* * * * *

UNITED STATES PATENT AND TRADEMARK OFFICE
CERTIFICATE OF CORRECTION

PATENT NO.    : 5,124,660
DATED         : June 23, 1992
INVENTOR(S)   : Ugur Cilingiroglu It is certified that error appears in the above-identified patent and that said Letters Patent is hereby corrected as shown below:

<u>Column 6,</u>
Line 6, delete "t" and insert -- to --
Line 10, delete "problem" and insert -- probe --
Line 46, delete "is" and insert -- if --
Line 47, delete "detected" and insert -- detect --
Line 50, delete "electrodes" and insert -- electrode --
Line 51, delete "components" and insert -- component --
Line 53, delete "electrodes" and insert -- electrode --
Line 64, delete "supply" and insert -- supplying --

Signed and Sealed this

Eighth Day of April, 2003

JAMES E. ROGAN
*Director of the United States Patent and Trademark Office*